US010509501B2

(12) United States Patent
Liu et al.

(10) Patent No.: US 10,509,501 B2
(45) Date of Patent: Dec. 17, 2019

(54) PRESSURE-SENSITIVE DISPLAY PANEL, MANUFACTURING METHOD THEREOF AND PRESSURE-SENSITIVE DISPLAY DEVICE (71) Applicants: BOE Technology Group Co., Ltd., Beijing (CN); Beijing BOE Optoelectronics Technology Co., Ltd., Beijing (CN)

(72) Inventors: Yingming Liu, Beijing (CN); Xue Dong, Beijing (CN); Hailin Xue, Beijing (CN); Xiaochuan Chen, Beijing (CN); Haisheng Wang, Beijing (CN); Xiaoliang Ding, Beijing (CN); Shengji Yang, Beijing (CN); Weijie Zhao, Beijing (CN); Changfeng Li, Beijing (CN); Wei Liu, Beijing (CN); Pengpeng Wang, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 60 days.

(21) Appl. No.: 15/743,497

(22) PCT Filed: Aug. 1, 2017

(86) PCT No.: PCT/CN2017/095510
§ 371 (c)(1),
(2) Date: Jan. 10, 2018

(87) PCT Pub. No.: WO2018/054174
PCT Pub. Date: Mar. 29, 2018

(65) Prior Publication Data
US 2019/0079626 A1    Mar. 14, 2019

(30) Foreign Application Priority Data

Sep. 22, 2016 (CN) .......................... 2016 1 0844352

(51) Int. Cl.
G06F 3/041 (2006.01)
G02F 1/1343 (2006.01)
(Continued)

(52) U.S. Cl.
CPC .......... *G06F 3/0414* (2013.01); *G02F 1/1343* (2013.01); *G02F 1/13338* (2013.01);
(Continued)

(58) Field of Classification Search
CPC combination set(s) only.
See application file for complete search history.

(56) References Cited

U.S. PATENT DOCUMENTS

2004/0173372 A1  9/2004  Suda
2016/0026285 A1  1/2016  Qin et al.
(Continued)

FOREIGN PATENT DOCUMENTS

CN    103176302 A    6/2013
CN    103676358 A    3/2014
(Continued)

OTHER PUBLICATIONS

Sep. 27, 2017—(WO) International Search Report and Written Opinion Appn PCT/CN2017/095510 with English Tran.
(Continued)

*Primary Examiner* — Van N Chow
(74) *Attorney, Agent, or Firm* — Banner & Witcoff, Ltd.

(57) ABSTRACT

A pressure-sensitive display panel, a manufacturing method thereof and a pressure-sensitive display device are provided. The pressure-sensitive display panel includes: a display panel and a predetermined electrode on an outer side of the
(Continued)

display panel, an array substrate in the display panel including a base substrate and a predetermined functional layer formed on the base substrate and formed of a conductive material; and a pressure-sensitive control unit. An overlapping region is between an orthographic projection region of the predetermined functional layer on the base substrate and an orthographic projection region of the predetermined electrode on the base substrate, and both the predetermined functional layer and the predetermined electrode are connected to the pressure-sensitive control unit.

18 Claims, 4 Drawing Sheets

(51) Int. Cl.
  *G02F 1/1333* (2006.01)
  *G02F 1/1335* (2006.01)
  *G02F 1/1362* (2006.01)
(52) U.S. Cl.
  CPC .. *G02F 1/133345* (2013.01); *G02F 1/133512* (2013.01); *G02F 1/133514* (2013.01); *G02F 1/134309* (2013.01); *G06F 3/0412* (2013.01); *G02F 1/133308* (2013.01); *G02F 2001/134318* (2013.01); *G02F 2001/136218* (2013.01); *G02F 2201/121* (2013.01); *G02F 2201/123* (2013.01); *G06F 2203/04103* (2013.01)

(56) References Cited

U.S. PATENT DOCUMENTS

2016/0259195 A1   9/2016  Shin et al.
2017/0308221 A1*  10/2017 Li ...................... G02B 6/0051

FOREIGN PATENT DOCUMENTS

| CN | 105278750 A | 1/2016 |
| CN | 105739790 A | 7/2016 |
| CN | 105824469 A | 8/2016 |
| CN | 105911736 A | 8/2016 |
| CN | 106292035 A | 1/2017 |

OTHER PUBLICATIONS

Feb. 28, 2017—(CN) Search Report Appn 201610844352.4 with English Tran.
May 9, 2017—(CN) First Office Action Appn 201610844352.4 with English Tran.
Aug. 25, 2017—(CN) Second Office Action Appn 201610844352.4 with English Tran.
Dec. 22, 2017—(CN) Third Office Action Appn 201610844352.4 with English Tran.

* cited by examiner

- manufacturing a display panel, an array substrate in the display panel including a base substrate and a predetermined functional layer made of a conductive material and formed on the base substrate — 401

- providing a predetermined electrode on an outer side of the display panel, an overlapping region being between an orthographic projection region of the functional layer on the base substrate and an orthographic projection region of the predetermined electrode on the base substrate — 402

- connecting both the predetermined functional layer and the predetermined electrode to a pressure-sensitive control unit to form the pressure-sensitive display panel — 403

PRESSURE-SENSITIVE DISPLAY PANEL, MANUFACTURING METHOD THEREOF AND PRESSURE-SENSITIVE DISPLAY DEVICE

The application is a U.S. National Phase Entry of International Application No. PCT/CN2017/095510 filed on Aug. 1, 2017, designating the United States of America and claiming priority to Chinese Patent Application No. 201610844352.4, filed on Sep. 22, 2016. The present application claims priority to and the benefit of the above-identified applications and the above-identified applications are incorporated by reference herein in their entirety.

TECHNICAL FIELD

Embodiments of the present disclosure relate to a pressure-sensitive display panel, a manufacturing method thereof and a pressure-sensitive display device.

BACKGROUND

With the development of display technologies, pressure-sensitive display panels are more and more used in electronic products such as mobile phones and tablet PCs. The pressure-sensitive display panels detect a press force applied by a user on the pressure-sensitive display panels, and then display a corresponding image according to the user's press force.

SUMMARY

Embodiments of the present disclosure provide a pressure-sensitive display panel, a manufacturing method of the pressure-sensitive display panel and a pressure-sensitive display device, and the pressure-sensitive display panel has a relatively small thickness.

In a first aspect, at least one embodiment of the present disclosure provides a pressure-sensitive display panel, the pressure-sensitive display panel includes: a display panel comprising an array substrate, the array substrate comprising a base substrate and a predetermined functional layer which is formed on the base substrate and formed of a conductive material; a predetermined electrode on an outer side of the display panel; and a pressure-sensitive control unit. An overlapping region is between an orthographic projection region of the predetermined functional layer on the base substrate and an orthographic projection region of the predetermined electrode on the base substrate, and both the predetermined functional layer and the predetermined electrode are connected to the pressure-sensitive control unit.

For example, the outer side of the display panel is a light incident side of the display panel.

For example, one of the predetermined functional layer and the predetermined electrode comprises an auxiliary electrode, an overlapping region is between an orthographic projection region of the auxiliary electrode on the base substrate and an orthographic projection region of the other of the predetermined functional layer and the predetermined electrode on the base substrate, and the auxiliary electrode is connected to the pressure-sensitive control unit.

For example, the predetermined functional layer further comprises a light-shielding pattern, and no overlapping region is between the orthographic projection region of the auxiliary electrode on the base substrate and an orthographic projection region of the light-shielding pattern on the base substrate.

For example, a shielding electrode is on the base substrate, and the orthographic projection region of the auxiliary electrode on the base substrate is within an orthographic projection region of the shielding electrode on the base substrate.

For example, a buffer layer, an active layer, a gate insulation layer, a gate pattern, an interlayer dielectric layer, and a source/drain layer pattern are sequentially on the base substrate, and the source/drain layer pattern comprises a source electrode, a drain electrode, and the shielding electrode.

For example, an insulation layer and a common electrode layer pattern are sequentially on the base substrate; and the common electrode layer pattern comprises a plurality of common electrodes arranged in an array, the plurality of common electrodes comprises at least one touch common electrode, each touch common electrode is connected to one shielding electrode through a via hole in the insulation layer, and the shielding electrodes that any two of the touch common electrodes are respectively connected with are different from each other.

For example, the pressure-sensitive display panel further comprises a touch control unit. Each shielding electrode connected with the touch common electrode is connected with the touch control unit.

For example, the insulation layer, the common electrode layer pattern, a passivation layer and a pixel electrode pattern are sequentially on the base substrate.

For example, the auxiliary electrode comprises an effective auxiliary electrode and a connection auxiliary electrode, and the effective auxiliary electrode is connected to the pressure-sensitive control unit via the connection auxiliary electrode; an effective area of a region of the auxiliary electrode on the base substrate is a sum of a first effective area and a second effective area, the first effective area is an area of an overlapping region between an orthographic projection region, on the base substrate, of the effective auxiliary electrodes located in the region of the auxiliary electrode and the orthographic projection region of the other of the predetermined functional layer and the predetermined electrode, and the second effective area is an area of an overlapping region in the region of the auxiliary electrode region and between an orthographic projection region, on the base substrate, of the connection auxiliary electrode connected to the effective auxiliary electrodes in the region of the auxiliary electrode and the orthographic projection region of the other of the predetermined functional layer and the predetermined electrode; and the effective area of the region of the auxiliary electrode region on the base substrate close to the pressure-sensitive control unit is greater than the effective area of the region of the auxiliary electrode region on the base substrate away from the pressure-sensitive control unit.

For example, the display panel further comprises a color filter substrate which comprises a black matrix, and the orthographic projection region of the auxiliary electrode on the base substrate is within an orthographic projection region of the black matrix on the base substrate.

For example, the auxiliary electrode comprises at least two first strip electrodes and at least one second strip electrode, a length direction of each of the first strip electrodes is intersected with a length direction of the second strip electrode, a (2n+1)th first strip electrode and a (2n+2)th first strip electrode are connected together via the at least one second strip electrode, and n is an integer greater than or equal to zero.

For example, the auxiliary electrode comprises at least four first strip electrodes, the (2n+1)th first strip electrode, the (2n+2)th first strip, a (2n+3)th first strip electrode and a (2n+4)th first strip electrode are sequentially arranged in a direction from a position away from the pressure-sensitive control unit to a position close to the pressure-sensitive control unit, the (2n+1)th first strip electrode and the (2n+2)th first strip electrode are connected together via p second strip electrodes, the (2n+3)th first strip electrode and the (2n+4)th first strip electrode are connected together via q second strip electrodes, each of p and q is an integer greater than or equal to 1, and q is greater than p.

For example, the predetermined electrode is a middle frame on a light incident side of the display panel.

In a second aspect, at least one embodiment of the present disclosure provides a method for manufacturing the pressure-sensitive display panel, and the method includes: manufacturing the display panel, the array substrate in the display panel comprising the base substrate and the predetermined functional layer which is on the base substrate and formed of the conductive material; providing the predetermined electrode on the outer side of the display panel, the overlapping region being between the orthographic projection region of the predetermined functional layer on the base substrate and the orthographic projection region of the predetermined electrode on the base substrate; and connecting both the predetermined functional layer and the predetermined electrode to the pressure-sensitive control unit to form the pressure-sensitive display panel.

For example, the manufacturing the display panel comprises: forming the predetermined functional layer on the base substrate, wherein the predetermined functional layer comprises a light-shielding pattern and an auxiliary electrode, an orthographic projection region of the auxiliary electrode on the base substrate overlaps the orthographic projection region of the predetermined electrode on the base substrate and does not overlap an orthographic projection region of the light-shielding pattern on the base substrate, and the auxiliary electrode is connected to the pressure-sensitive control unit.

For example, the manufacturing the display panel further comprises: forming a shielding electrode on the base substrate formed with the predetermined functional layer, wherein the orthographic projection region of the auxiliary electrode on the base substrate is within an orthographic projection region of the shielding electrode on the base substrate.

For example, the manufacturing the display panel further comprises: sequentially forming an insulation layer and a common electrode layer pattern on the base substrate, wherein the common electrode layer pattern comprises a plurality of common electrodes arranged in an array, the plurality of common electrodes comprises at least one touch common electrode, each touch common electrode is connected to one shielding electrode through a via hole in the insulation layer, the shielding electrodes that any two of the touch common electrodes are respectively connected with are different from each other, and each shielding electrode connected to the touch common electrode is connected to the touch control unit.

In a third aspect, at least one embodiment of the present disclosure provides a pressure-sensitive display device including the pressure-sensitive display panel according the first aspect.

In a fourth aspect, at least one embodiment of the present disclosure provides a pressure-sensitive display panel, and the pressure-sensitive display panel includes: a display panel comprising an array substrate, the array substrate comprising a base substrate and a predetermined functional layer which is on the base substrate and formed of a conductive material; and a predetermined electrode on an outer side of the display panel. The pressure-sensitive display panel further comprises a pressure-sensitive unit, the pressure-sensitive unit comprises the predetermined functional layer and the predetermined electrode, an overlapping region is between an orthographic projection region of the predetermined functional layer on the base substrate and an orthographic projection region of the predetermined electrode on the base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 5-1 is a partial schematic structural view of an array substrate in a display panel according to the embodiments of the present disclosure;

FIG. 5-2 is another partial schematic view of the array substrate in the display panel according to the embodiments of the present disclosure;

FIG. 5-3 is still another partial schematic structural view of the array substrate in the display panel according to the embodiments of the present disclosure;

FIG. 5-4 is a schematic structural view of the array substrate in the display panel according to the embodiments of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described changes, the relative position relationship may be changed accordingly.

In some technologies, a pressure-sensitive display panel includes a panel body and a pressure-sensitive unit which is on a light incident side of the panel body. For example, the panel body includes a color filter substrate and an array substrate which are bonded with each other, and liquid crystals located between the color filter substrate and the array substrate. For example, the pressure-sensitive unit includes an insulation layer, a predetermined electrode disposed on one side of the insulation layer, and a plurality of auxiliary electrodes disposed on the other side of the insulation layer, both the plurality of auxiliary electrodes and the predetermined electrode are connected to a control unit. In a situation where a user does not press the pressure-sensitive display panel, the value of the capacitance between each auxiliary electrode and the predetermined electrode is a preset capacitance value. In a situation where the user presses the region provided with the auxiliary electrode of the pressure-sensitive display panel, the distance between the auxiliary electrode and the predetermined electrode changes; and the press force of the user on the pressure-sensitive display panel is negatively correlated with the distance between the auxiliary electrode and the predetermined electrode, the capacitance between the auxiliary electrode and the predetermined electrode is negatively correlated with the distance between the auxiliary electrode and the predetermined electrode, and thus, the control unit determines the press force of the user on the pressure-sensitive display panel by detecting the value of the capacitance between the auxiliary electrode and the predetermined electrode.

In the research, the inventors of the present application noted that, in the above technologies, the pressure-sensitive display panel includes not only the panel body but also the pressure-sensitive unit which is on the light incident side of the array substrate of the panel body. Therefore, the pressure-sensitive display panel is thick.

Figure 1A:
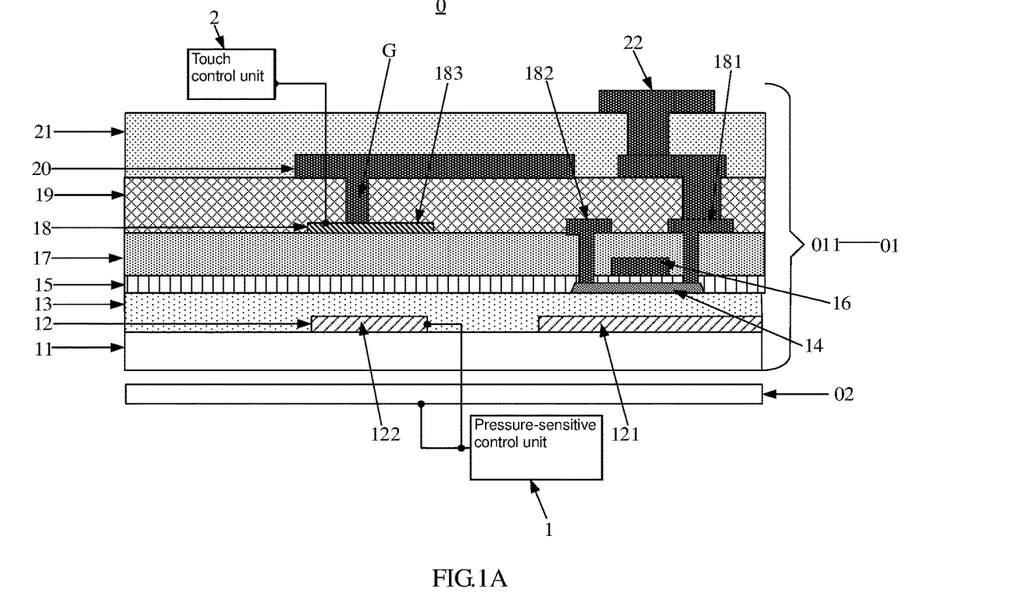
FIG. 1A is a schematic structural view of a pressure-sensitive display panel according to embodiments of the present disclosure.
Figure 1B:
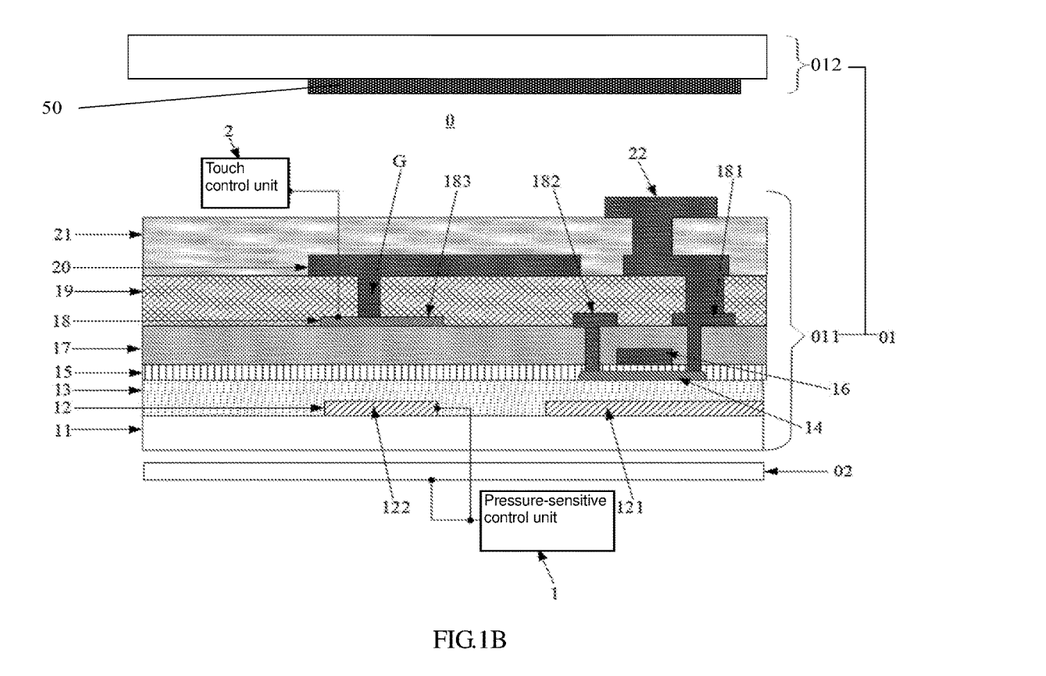
FIG. 1B is a schematic structural view of the pressure-sensitive display panel according to the embodiments of the present disclosure.

As shown in FIG. 1A and FIG. 1B, at least one embodiment of the present disclosure provides a pressure-sensitive display panel 0, the pressure-sensitive display panel 0 for example includes a display panel (for example, a low temperature poly-silicon (abbreviated as LTPS) display panel, a high-temperature poly-silicon display panel or display panel of other type) 01, and a predetermined electrode 02 on an outer side of the display panel 01. An array substrate 011 in the display panel 01 includes a base substrate 11 and a predetermined functional layer 12 made of a conductive material and formed on the base substrate 11. The predetermined functional layer 12 and the predetermined electrode 02 are respectively located on two sides of the base substrate 11; and an overlapping region is between an orthographic projection region of the predetermined functional layer 12 on the base substrate 11 and an orthographic projection of the predetermined electrode 02 on the base substrate 11, and both the predetermined functional layer 12 and the predetermined electrode 02 are in connection with a pressure-sensitive control unit 1.

The pressure-sensitive control unit 1 is configured for detecting a capacitance between the predetermined functional layer 12 and the predetermined electrode 02. For example, the pressure-sensitive control unit is a general processor, a digital signal processor (DSP), an application specific integrated circuit (ASIC), a field programmable gate array (FPGA) or other programmable logic device, discrete gate or transistor logic device, or discrete hardware components.

For example, a gap is formed between the predetermined electrode 02 and the base substrate 11 (for example, a gas layer is formed between the predetermined electrode 02 and the base substrate 11). Therefore, in a situation where the pressure-sensitive display panel 0 is pressed, the distance between the predetermined electrode 02 and the predetermined functional layer 12 changes at the pressed position, so that the capacitance between the predetermined electrode 02 and the predetermined functional layer 12 changes. By detecting the change of the capacitance between the predetermined electrode 02 and the predetermined functional layer 12, the touch position is determined.

For example, the outer side of the display panel 01 is a light incident side or a display side of the display panel 01, and the light incident side is a side where the display panel 01 is irradiated with a backlight source and is a non-display side. In a situation where the predetermined electrode 02 is located on the light incident side of the display panel 01, the influence of the static electricity from a touch object (for example, a finger) on the detection result of the pressure-sensitive unit including the predetermined functional layer and the predetermined electrode is small.

As described above, the embodiments of the present disclosure provide the pressure-sensitive display panel. The pressure-sensitive display panel includes the display panel and the predetermined electrode disposed on the outer side of the display panel, and both the predetermined functional layer in the display panel and the predetermined electrode on the outer side of the display panel are connected to the pressure-sensitive control unit, and the predetermined functional layer in the display panel serves as an auxiliary electrode in the pressure-sensitive unit. That is, only the predetermined electrode is provided on the outer side of the display panel in the embodiments of the present disclosure, there is no need to provide the auxiliary electrode and an insulation layer on the outer side of the display panel, and thus the thickness of the pressure-sensitive display panel is reduced.

For example, the predetermined functional layer 12 includes the auxiliary electrode 122. For example, the predetermined functional layer 12 includes a light shielding (abbreviated as LS) pattern 121 and the auxiliary electrode 122 (for example, the LS pattern 121 and the auxiliary electrode 122 are in a same layer). The orthographic projection region of the auxiliary electrode 122 on the base substrate 11 and the orthographic projection region of the predetermined electrode 02 on the base substrate 11 have an overlapping region (for example, both the shape and the size of the overlapping region is the same as those of the auxiliary electrode 122), the orthographic projection region of the auxiliary electrode 122 on the base substrate 11 and the orthographic projection region of the light-shielding pattern 121 on the base substrate 11 does not overlap with each other, and the auxiliary electrode 122 is connected to the pressure-sensitive control unit 1. The light-shielding pattern 121 is configured for preventing the light emitted by the backlight source from irradiating to an active layer 14 of a thin film transistor included in the array substrate and the light-shielding pattern 121 is disposed below a channel of the thin film transistor (TFT) in the display panel. The orthographic projection region of the light-shielding pattern 121 on the base substrate 11 and the orthographic projection region of the auxiliary electrode 122 on the base substrate 11 do not overlap with each other. That is, the auxiliary electrode 122 is not disposed below the channel of the TFT, and thus, in a situation where the auxiliary electrode 122 is applied with a voltage, the voltage of the auxiliary electrode 122 does not affect the channel of the TFT. For example, the light-shielding pattern 121 and the auxiliary electrode 122 in the embodiments of the present disclosure are independent from each other. That is, the light-shielding pattern 121 is not connected to the auxiliary electrode 122. In a situation where the voltage is applied to the auxiliary electrode 122, no voltage is input to the light-shielding pattern 121.

For example, the predetermined functional layer made of the conductive material is any conductive layer in the display panel. It is to be noted that, in the pressure-sensitive display panel 0 shown in FIG. 1B, the display panel 01 for example includes a color filter substrate 012 disposed opposite to the array substrate, the color filter substrate 012 includes a black matrix 50, and the orthographic projection region of the auxiliary electrode 122 on the array substrate 011 is within the orthographic projection region of the black matrix 50 in the color filter substrate 012 on the base substrate 11 of the array substrate 011. That is, the black matrix 50 in the color filter substrate 012 effectively shields the auxiliary electrode in the embodiments of the present disclosure, so that the auxiliary electrode in the embodiments of the present disclosure does not affect the display of the pressure-sensitive display panel.

Figure 1C:
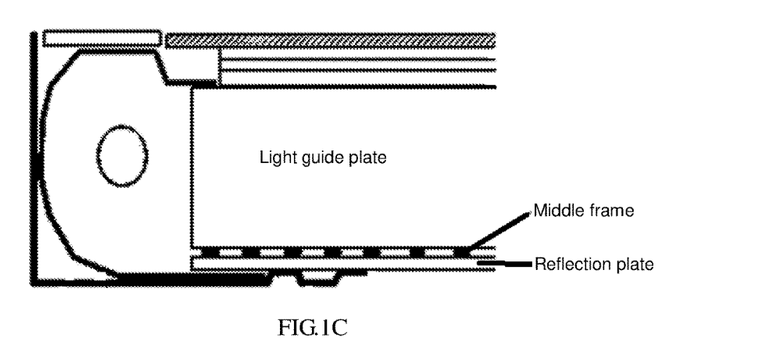
FIG. 1C is a schematic structural view of the pressure-sensitive display panel in which a predetermined electrode is provided as a middle frame according to the embodiments of the present disclosure.

For example, the predetermined electrode 02 in the embodiments of the present disclosure is a middle frame disposed on the light incident side of the display panel. For example, as shown in FIG. 1C, the middle frame is one of the components of the backlight source on the light incident side of the display panel, and is, for example, a metal mesh plate located between a reflection plate and a light guide plate of the backlight source.

For example, a shielding electrode 183 is formed on the base substrate 11. The orthographic projection region of the auxiliary electrode 122 on the base substrate 11 is within the orthographic projection region of the shielding electrode 183 on the base substrate 11. The shielding electrode 183 is configured to be applied with a constant voltage which is not equal to 0 during operation. For example, a buffer layer 13, the active layer 14, a gate insulation layer 15, a gate pattern 16, an interlayer dielectric layer 17, and a source/drain layer pattern 18 are sequentially formed on the base substrate 11 on which the predetermined functional layer 12 is formed. The source/drain layer pattern 18 for example includes a source electrode 181, a drain electrode 182 and the shielding electrode 183. The orthographic projection region of the auxiliary electrode 122 on the base substrate 11 is within the orthographic projection region of the shielding electrode 183 on the base substrate 11. The shielding electrode 183 is formed on the base substrate 11 and the shielding electrode 183 is located between the auxiliary electrode 122 and the light emitting side of the display panel; in a situation where the user touches the pressure-sensitive display panel 0 by using the finger, the user's finger is a conductor and the static electricity from the user's finger affects the voltages of the electrodes near the finger of the user, however, in the embodiments of the disclosure, due to that the shielding electrode 183 is disposed between the auxiliary electrode 122 and the user's finger, the shielding electrode 183 prevents the static electricity from the user's finger from affecting the voltage applied to the auxiliary electrode 122.

For example, an insulation layer (for example, a planarization insulation layer, short for planarization layer) 19 and a common electrode layer pattern 20 are further formed on the base substrate 11. For example, the insulation layer 19, the common electrode layer pattern 20, a passivation layer 21 and a pixel electrode pattern 22 are sequentially formed on the base substrate 11 formed with the source/drain layer pattern 18. The common electrode layer pattern 20 for example includes a plurality of common electrodes arranged in an array. The plurality of common electrodes includes at least one touch common electrode (namely, at least one common electrode is further employed for realizing a touch control function), and each touch common electrode is connected to one shielding electrodes 183 by a via hole G in the insulation layer 19, and the shielding electrodes 183 respectively connected to any two of the touch common electrodes are different from each other. Each shielding electrode 183 connected to the touch common electrode is connected to the touch control unit 2. The touch common electrode in the display panel is connected to the shielding electrode 183 and the shielding electrode 183 is further connected to the touch control unit 2, and thus, the touch common electrode is used as a self-capacitance touch electrode and the shielding electrode serves as a touch control line connecting the touch electrode to the touch control unit 2, and accordingly a touch control function of the pressure-sensitive display panel is realized, and the thickness of the pressure-sensitive display panel having the touch control function is reduced.

The touch control unit 2 is configured for detecting the self-capacitance of the touch common electrode to determine the touch position. For example, the touch control unit is a general processor, a digital signal processor (DSP), an application specific integrated circuit (ASIC), a field programmable gate array (FPGA) or other programmable logic device, discrete gate or transistor logic device, or discrete hardware component.

Figure 2:
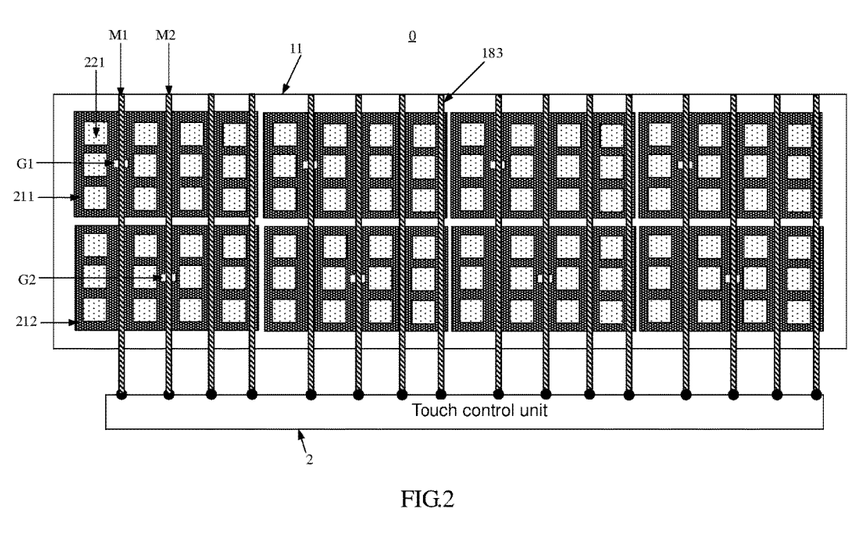
FIG. 2 is a partial schematic structural structure of the pressure-sensitive display panel according to the embodiments of the present disclosure.

FIG. 2 is a partial structural view of the pressure-sensitive display panel 0 according to the embodiments of the present disclosure. As shown in FIG. 2, the plurality of common electrodes are disposed in the display panel, and each of the common electrodes is the touch common electrode (that is, each of the common electrodes is connected to one shielding electrode 183 through the via hole), and each of the common electrodes for example corresponds to twelve pixel electrodes 221. A plurality of touch control lines (i.e., the shielding electrodes 183 in FIG. 1) are formed in the display panel. The touch control line M1 is connected to the common electrode 211 through the via hole G1, and the touch control line M2 is connected to the common electrode 212 through the via hole G2; namely, the common electrode 211 is the touch common electrode connected to the touch control line M1, and the common electrode 212 is the touch common electrode connected to the touch control line M2. During the touch control, the touch control unit 2 determines whether the region provided with the common electrode 211 of the display panel is touched by the user by inputting a touch signal to the common electrode 211 through the touch control line M1 and determine whether the region provided with the common electrode 212 of the display panel is touched by the user by inputting the touch signal to the common electrode 212 through the touch control line M2.

Figure 3:
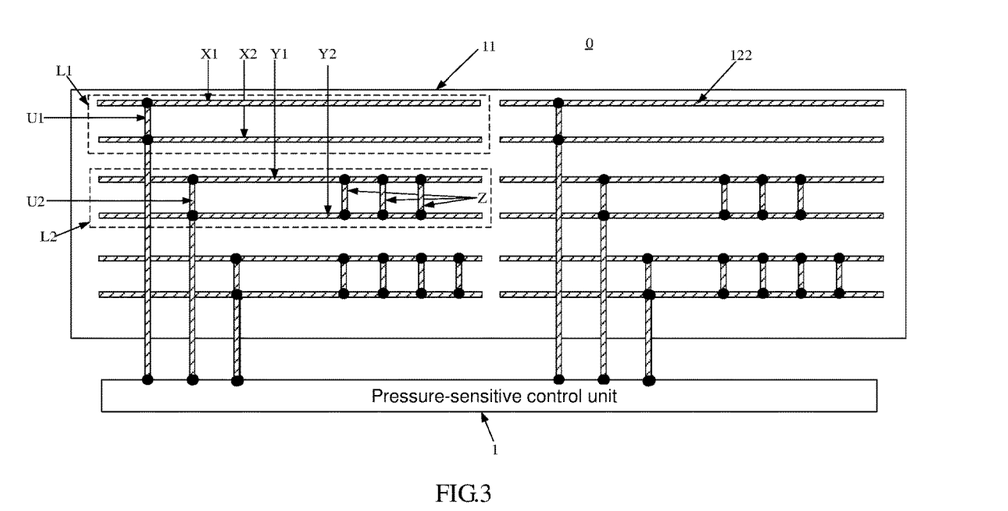
FIG. 3 is another partial schematic view of the pressure-sensitive display panel according to the embodiments of the present disclosure.

For example, as shown in FIG. 3, the auxiliary electrode 122 (six auxiliary electrodes 122 are shown in FIG. 3 as an example) includes an effective auxiliary electrode (referring to X1, X2, Y1 and Y2) and a connection auxiliary electrode (referring to U1, U2 and Z), and the extension direction of the effective auxiliary electrode and the extension direction of the connection auxiliary electrode are intersected with each other. The effective auxiliary electrode is connected to the pressure-sensitive control unit through the connection auxiliary electrode. For example, as shown in FIG. 3, each auxiliary electrode 122 includes two effective auxiliary electrodes (referring to X1 and X2, Y1 and Y2 in FIG. 3) which are provided in substantially the same extension direction and are adjacent to each other and a first connection auxiliary electrode (referring to U1, U2) which connects the two adjacent effective auxiliary electrodes and connects the pressure-sensitive control unit. For example, the first connection auxiliary electrode is connected to its corresponding effective auxiliary electrode through a via hole (as shown by a black dot in FIG. 3). For example, the effective auxiliary electrode or the first connection auxiliary electrode is in a same layer as the above light-shielding pattern. As for a first auxiliary electrode and a second auxiliary electrode adjacent to each other, the first connection auxiliary electrode of the first auxiliary electrode and the effective auxiliary electrodes of the second auxiliary electrode are intersected with each other and are insulated from each other. For example, except the auxiliary electrode 122 farthest from the pressure-sensitive control unit, each of the auxiliary electrodes 122 includes a plurality of second connection auxiliary electrodes (referring to Z), each second connection auxiliary electrode Z connects adjacent effective auxiliary electrodes of the same auxiliary electrode 122 and the entirety of each second connection auxiliary electrode is between the adjacent effective auxiliary electrodes of the same auxiliary electrode 122. For example, as shown in FIG. 3, the number of the second connection auxiliary electrodes Z included in the auxiliary electrode 122 away from the pressure-sensitive control unit 1 is smaller than the number of the second connection auxiliary electrodes Z included in the auxiliary electrode 122 close to the pressure-sensitive control unit 1.

For example, an effective area of a region of the auxiliary electrode on the base substrate is the sum of a first effective area and a second effective area. The first effective area is an area of an overlapping region between the orthographic projection region, on the base substrate, of the effective auxiliary electrodes located in the region of the auxiliary electrode and the orthographic projection region of the predetermined electrode on the base substrate. The second effective area is an area of an overlapping region in the region of the auxiliary electrode region and between the orthographic projection region, on the base substrate, of the connection auxiliary electrode connected to the effective auxiliary electrodes in the region of the auxiliary electrode and the orthographic projection region of the predetermined electrode on the base substrate. The effective area of the region of the auxiliary electrode close to the pressure-sensitive control unit is larger than the effective area of the region of the auxiliary electrode away from the pressure-sensitive control unit.

FIG. 3 is a partial schematic structural view of the pressure-sensitive display panel according to the embodiments of the present disclosure. As shown in FIG. 3, the strip electrode X1 and the strip electrode X2 are connected together via the strip electrode U1 and are connected to the pressure-sensitive control unit 1 via the strip electrode U1; the strip electrode Y1 and the strip electrode Y2 are connected together via the strip electrode U2 and the strip electrodes Z and are connected to the pressure-sensitive control unit 1 via the strip electrode U2.

The strip electrode X1, the strip electrode X2, the strip electrode Y1, and the strip electrode Y2 are the effective auxiliary electrodes on the base substrate 11. The strip electrode U1, the strip electrode U2 and the strip electrodes Z are the connection auxiliary electrodes on the base substrates 11. The strip electrode X1 and the strip electrode X2 are in a first auxiliary electrode region L1 on the base substrate 11, and the strip electrode Y1, the strip electrode Y2, and the strip electrodes Z are in a second auxiliary electrode region L2 on the base substrate 11, the first auxiliary electrode region L1 is away from the pressure-sensitive control unit 1, and the second auxiliary electrode region L2 is close to the pressure-sensitive control unit 1.

The effective area of the first auxiliary electrode region L1 on the base substrate 11 is the sum of the area of the overlapping region between the orthographic projection region of both the strip electrode X1 and the strip electrode X2 on the base substrate 11 in the first auxiliary electrode region L1 and the orthographic projection region of the predetermined electrode on the base substrate 11, and the area of the overlapping region in the first auxiliary electrode region L1 and between the orthographic projection region of the strip electrode U1 on the base substrate 11 and the orthographic projection region of the predetermined electrode on the base substrate 11. The effective area of the second auxiliary electrode region L2 on the base substrate 11 is the sum of the area of the overlapping region between the orthographic projection region of both the strip electrode Y1 and the strip electrode Y2 on the base substrate 11 in the second auxiliary electrode region L2 and the orthographic projection region of the predetermined electrode on the base substrate 11, and the area of the overlapping region in the second auxiliary electrode region L2 and between the orthographic projection region of both the strip electrode U2 and the strip electrodes Z on the base substrate 11 and the orthographic projection region of the predetermined electrode on the base substrate 11. It is seen from FIG. 3, the first auxiliary electrode region L1 is away from the pressure-sensitive control unit 1 and the second auxiliary electrode region L2 is close to the pressure-sensitive control unit 1. The effective area of the region of the auxiliary electrode to is proportional to the capacitance of the region of the auxiliary electrode. That is, as the effective area of the region of the auxiliary electrode increases, the capacitance of the region of the auxiliary electrode also increases.

The resistance that the first auxiliary electrode region L1 corresponds to is the resistance that the strip electrode X1, the strip electrode X2, and the strip electrode U1 correspond to (including the resistance formed by the strip electrode X1, the strip electrode X2, and the strip electrode U1). The resistance that the second auxiliary electrode region L2 corresponds to is the resistance that the strip electrode Y1, the strip electrode Y2, the strip electrode U2 and the strip electrodes Z correspond to (including the resistance formed by the strip electrode Y1, the strip electrode Y2, the strip electrode U2 and the strip electrodes Z). The capacitance that the first auxiliary electrode region L1 corresponds to is the capacitance that the strip electrode X1, the strip electrode X2 and the strip electrode U1 correspond to (including the capacitance formed by the strip electrode X1, the strip electrode X2 and the strip electrode U1). The capacitance that the second auxiliary electrode region L2 corresponds to is the capacitance that the strip electrode Y1, the strip electrode Y2, the strip electrode U2 and the strip electrodes Z correspond to (including the capacitance formed by the strip electrode Y1, the strip electrode Y2, the strip electrode U2 and the strip electrode Z).

It can be seen that the resistance that the first auxiliary electrode region L1 corresponds to is greater than the resistance that the second auxiliary electrode region L2 corresponds to, and the capacitance that the first auxiliary electrode region L1 corresponds to is smaller than the capacitance that the second auxiliary electrode region L2 corresponds to. Thus, the product of the resistance and the capacitance corresponding to the strip electrode X1, the strip electrode X2 and the strip electrode U1 tends to be consistent with the product of the resistance and the capacitance corresponding to the strip electrode Y1, the strip electrode Y2, the strip electrode U2 and the strip electrode Z, so that the products of the resistance and the capacitance of all auxiliary electrode regions of the pressure-sensitive display panel 0 tend to be consistent with each other, and thus the display effect of the pressure-sensitive display panel is effectively improved.

That is, the auxiliary electrode in FIG. 3 includes at least two first strip electrodes (referring to the strip electrode X1 and the strip electrode X2 in FIG. 3) and at least one second strip electrode (referring to the strip electrode U1, the strip electrode U2 or the strip electrodes Z in FIG. 3), the length direction of the first strip electrodes is intersected with the length direction of the second strip electrode, the (2n+1)th first strip electrode is connected to the (2n+2)th first strip electrode via the at least one second strip electrode, and n is an integer greater than or equal to zero. For example, the auxiliary electrode 122 includes at least four first strip electrodes, the (2n+1)th first strip electrode, the (2n+2)th first strip electrode, the (2n+3)th first strip electrode and the (2n+4)th first strip electrode are arranged in order from the position away from the pressure-sensitive control unit to the position close to the pressure-sensitive control unit, that is, the (2n+1)th first strip electrode and the (2n+2)th first strip electrode are located in a region on the base substrate 11 away from the pressure-sensitive control unit, and the (2n+3)th first strip electrode and the (2n+4)th first strip electrode are located in a region on the base substrate 11 close to the pressure-sensitive control unit. The (2n+1)th first strip electrode and the (2n+2)th first strip electrode are connected with each other via p second strip electrodes, the (2n+3)th first strip electrode and the (2n+4)th first strip electrode are connected with each other via q second strip electrodes, each of p and q is an integer greater than or equal to 1, and q is greater than p. That is to say, the sum of the numbers of the first connection auxiliary electrodes and the second connection auxiliary electrodes of the auxiliary electrode close to the pressure-sensitive control unit is greater than the sum of the numbers of the first connection auxiliary electrodes and the second connection auxiliary of the auxiliary electrode away from the pressure-sensitive control unit.

The effective area of the region of the auxiliary electrode comprising the (2n+1)th first strip electrode and the (2n+2)th first strip electrode on the base substrate is smaller than the effective area of the region of the auxiliary electrode comprising the (2n+3)th first strip electrode and the (2n+4)th first strip electrode on the base substrate.

The embodiments of the present disclosure provide the pressure-sensitive display panel. The pressure-sensitive display panel includes the display panel and the predetermined electrode disposed on the outer side of the display panel, the predetermined functional layer in the display panel and the predetermined electrode are connected to the pressure-sensitive control unit. The predetermined functional layer of the display panel includes the auxiliary electrode in the pressure-sensitive unit. That is, only the predetermined electrode is provided on the outer side of the display panel in the embodiments of the present disclosure, without the need of providing the auxiliary electrode and the insulation layer on the outer side of the display panel, and thus the thickness of the pressure-sensitive display panel is reduced.

Figure 4:
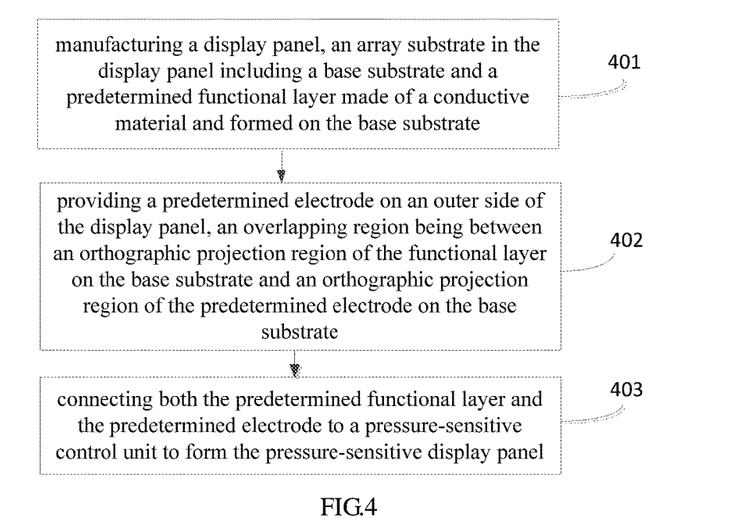
FIG. 4 is a flow chart of a method for manufacturing a pressure-sensitive display panel according to the embodiments of the present disclosure.

As shown in FIG. 4, the embodiments of the present disclosure further provide a method for manufacturing a pressure-sensitive display panel. The manufacturing method of the pressure-sensitive display panel for example includes: step 401, manufacturing a display panel, such as a low-temperature polysilicon display panel or display panel of other type, an array substrate in the display panel including a base substrate and a predetermined functional layer made of a conductive material and formed on the base substrate; step 402, providing a predetermined electrode on an outer side of the display panel (for example, a light incident side of the display panel), an overlapping region being between the orthographic projection region of the functional layer on the base substrate and the orthographic projection region of the predetermined electrode on the base substrate; and step 403, connecting both the predetermined functional layer and the predetermined electrode to a pressure-sensitive control unit to form the pressure-sensitive display panel.

The embodiments of the present disclosure provide the method for manufacturing the pressure-sensitive display panel. The pressure-sensitive display panel manufactured by the method includes the display panel and the predetermined electrode disposed on the outer side of the display panel, and both the predetermined functional layer in the display panel and the predetermined electrode are connected to the pressure-sensitive control unit, the predetermined functional layer in the display panel serves as an auxiliary electrode in the pressure-sensitive unit, that is, the outer side of the display panel in the present disclosure is provided with only the predetermined electrode, without providing the auxiliary electrode and an insulation layer on the outer side of the display panel, so the thickness of the pressure-sensitive display panel is reduced.

For example, the predetermined electrode in the embodiments of the present disclosure is a middle frame disposed outside the display panel.

For example, in the manufacturing of the display panel in step 401, the array substrate and a color filter substrate are separately manufactured, and then the array substrate and the color filter substrate are assembled to obtain a liquid crystal cell, and liquid crystals are dripped into the liquid crystal cell to obtain the display panel. For a specific method for manufacturing the color filter substrate, a specific method for manufacturing the color filter substrate in related technologies may be referred to, which is not described in detail in the embodiments of the present disclosure.

For example, the manufacturing of the display panel in step 401 includes: forming the predetermined functional layer on the base substrate, the predetermined functional layer including a light-shielding pattern and the auxiliary electrode. The orthographic projection region of the auxiliary electrode on the base substrate overlaps the orthographic projection region of the predetermined electrode on the base substrate and does not overlap the orthographic projection region of the light-shielding pattern on the base substrate. The auxiliary electrode is connected to the pressure-sensitive control unit.

For example, the manufacturing of the display panel in step 401 further includes: forming a shielding electrode on the base substrate on which the predetermined functional layer is formed, with the orthographic projection region of the auxiliary electrode on the base substrate located within the orthographic projection of the shielding electrode on the base substrate.

For example, the manufacturing of the display panel in step 401 further includes: sequentially forming an insulation layer (for example, a planarization layer) and a common electrode layer pattern on the base substrate. The common electrode layer pattern includes a plurality of common electrodes arranged in an array, the plurality of common electrodes includes at least one touch common electrode, each touch common electrode is connected to one shielding electrode through a via hole in the insulation layer, the shielding electrodes that any two of the touch common electrodes are respectively connected with are different from each other, and the shielding electrode that each touch common electrode is connected with is connected to a touch control unit.

The method provided by the embodiments of the present disclosure will be described in detail below with reference to FIG. 5-1 to FIG. 5-4.

Figure 51:
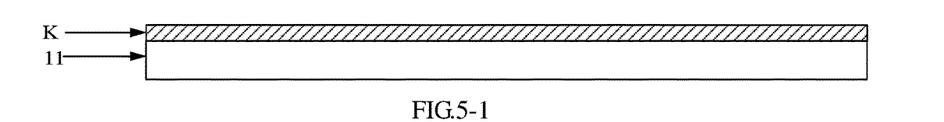
Figure 52:
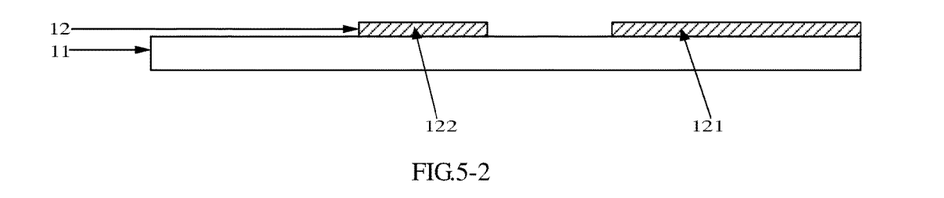

For example, in fabricating the array substrate in the display panel, as shown in FIG. 5-1, a light-shielding metal K is formed on the base substrate 11 first, and then the light-shielding metal K is patterned by adopting a patterning process to form the predetermined functional layer 12 shown in FIG. 5-2. The predetermined functional layer 12 for example includes the light-shielding pattern 121 and the auxiliary electrode 122. The orthographic projection region of the auxiliary electrode 122 on the base substrate 11 overlaps the orthographic projection region of the predetermined electrode on the base substrate 11 and does not overlap the orthographic projection region of the light-shielding pattern on the base substrate 11, and the auxiliary electrode 122 is connected to the pressure-sensitive control unit. The patterning process for example includes photoresist coating, light exposing, developing, etching and photoresist peeling.

Figure 53:
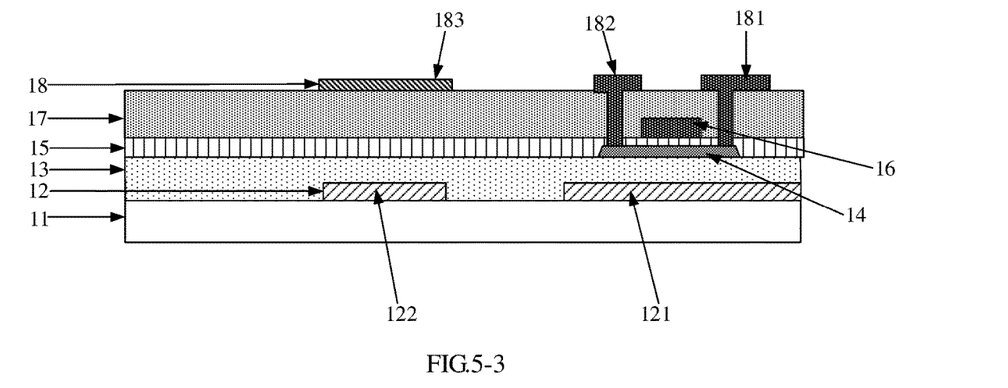

After forming the predetermined functional layer 12, as shown in FIG. 5-3, a buffer layer 13, an active layer 14, a gate insulation layer 15, a gate electrode pattern 16, an interlayer dielectric layer 17 and a source/drain layer pattern 18 are sequentially formed on the base substrate 11 formed with the predetermined functional layer 12. The source/drain layer pattern 18 for example includes a source electrode 181, a drain electrode 182 and the shielding electrode 183. The orthographic projection region of the auxiliary electrode 122 on the base substrate 11 is within the orthographic projection region of the shielding electrode 183 on the base substrate 11. For example, in forming the source/drain layer pattern 18, a metal layer is formed on the interlayer dielectric layer 17 first, and then the formed metal layer is patterned by adopting a patterning process to obtain the source/drain layer pattern 18. As the source/drain layer pattern 18 in the embodiments of the present disclosure is different from the source/drain layer pattern in the related technologies, the mask used in forming the source/drain layer pattern 18 in the embodiments of the present disclosure is different from the mask used in the formation of the source/drain layer pattern in the related technologies.

Figure 54:
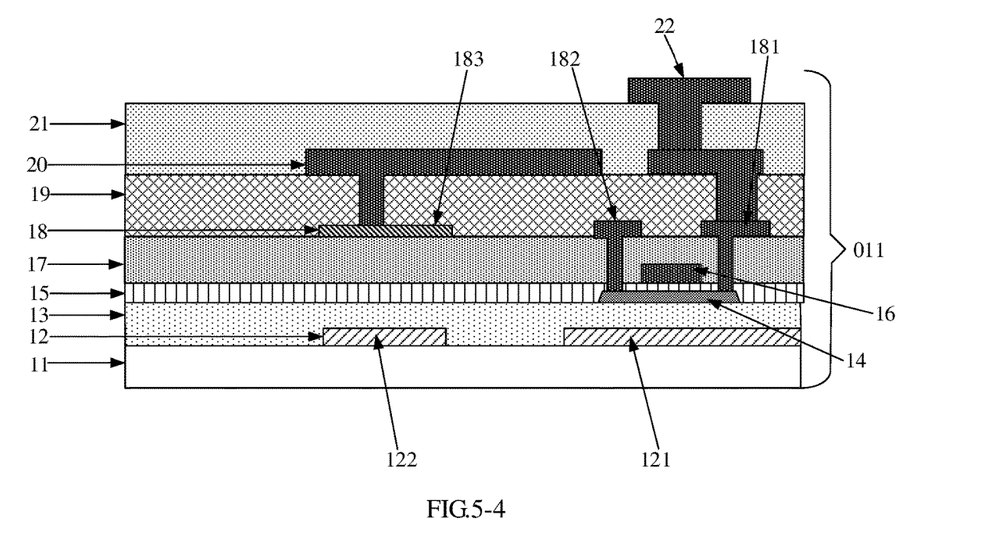

Then, as shown in FIG. 5-4, the insulation layer (for example, the planarization layer) 19, the common electrode layer pattern 20, a passivation layer 21 and a pixel electrode pattern 22 for example are sequentially formed on the base substrate 11 formed with the source/drain layer pattern 18. The common electrode layer pattern 20 for example includes the plurality of common electrodes arranged in the array, and the plurality of common electrodes include at least one touch common electrode, each touch common electrode is connected to one shielding electrode through the via hole in the insulation layer (that is, after the insulation layer is formed, the via hole is formed in the insulation layer, and then the common electrode layer pattern is formed on the insulation layer formed with the via hole). The shielding electrodes that any two of the touch common electrodes are respectively connected with are different from each other, and each shielding electrode connected with the touch common electrode is connected with the touch control unit.

In the embodiments of the present disclosure, the auxiliary electrode for example includes an effective auxiliary electrode and a connection auxiliary electrode, the effective auxiliary electrode is connected to the pressure-sensitive control unit through the connection auxiliary electrode. An effective area of a region of the auxiliary electrode on the base substrate is the sum of a first effective area and a second effective area; the first effective area is an area of an overlapping region between the orthographic projection region, on the base substrate, of the effective auxiliary electrodes located in the region of the auxiliary electrode and the orthographic projection region of the predetermined electrode on the base substrate; and the second effective area is an area of an overlapping region in the region of the auxiliary electrode region and between the orthographic projection region, on the base substrate, of the connection auxiliary electrode connected to the effective auxiliary electrodes in the region of the auxiliary electrode and the orthographic projection region of the predetermined electrode on the base substrate. The effective area of the region of the auxiliary electrode region on the base substrate close to the pressure-sensitive control unit is greater than the effective area of the region of the auxiliary electrode region on the base substrate away from the pressure-sensitive control unit. For example, the color filter substrate in the display panel includes a black matrix, and the orthographic projection region of the auxiliary electrode on the base substrate is within the orthographic projection region of the black matrix on the base substrate.

The auxiliary electrode for example includes at least two first strip electrodes and at least one second strip electrode. A length direction of the first strip electrodes is intersected with (for example, perpendicular to) a length direction of the second strip electrode, and the (2n+1)th first strip electrode is connected to the (2n+2)th first strip electrode by at least one second strip electrode, and n is an integer greater than or equal to zero. For example, the auxiliary electrode includes at least four first strip electrodes, the (2n+1)th first strip electrode, the (2n+2)th first strip electrode, the (2n+3)th first strip electrode and the (2n+4)th first strip electrode are sequentially arranged from the position away from the pressure-sensitive control unit to a position close to the pressure-sensitive control unit. The (2n+1)th first strip electrode and the (2n+2)th first strip electrode are connected together via p second strip electrodes, the (2n+3)th first strip electrode and the (2n+4)th first strip electrode are connected together via q second strip electrodes, each of q and q is an integer greater than or equal to 1, and q is greater than p.

The embodiments of the present disclosure provide the method for manufacturing the pressure-sensitive display panel. The pressure-sensitive display panel manufactured by the method includes the display panel and the predetermined electrode disposed on the outer side of the display panel, and the predetermined functional layer in the display panel and the predetermined electrode are both connected to the pressure-sensitive control unit, the predetermined functional layer in the display panel serves as the auxiliary electrode in the pressure-sensitive unit, that is, the outer side of the display panel in the present disclosure is provided with only the predetermined electrode, without the need of providing the auxiliary electrode and the insulation layer on the outer side of the display panel, so the thickness of the pressure-sensitive display panel is reduced.

Figure 6:
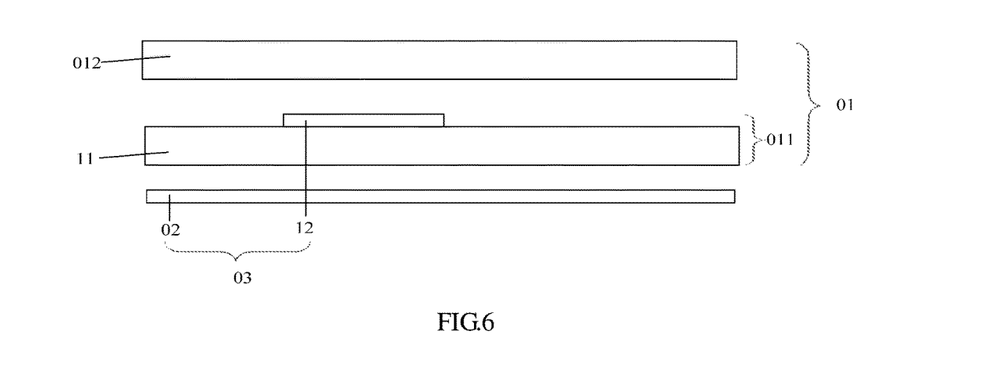
FIG. 6 is another schematic structural view of the pressure-sensitive display panel according to the embodiments of the present disclosure.

At least one embodiment of the present disclosure provides a pressure-sensitive display panel, as shown in FIG. 6, the pressure-sensitive display panel includes: a display panel 01 including an array substrate 011 which includes a base substrate 11 and a predetermined functional layer 12 formed on the base substrate 11 and made of a conductive material; and a predetermined electrode 02 located on an outer side of the display panel. The pressure-sensitive display panel further includes a pressure-sensitive unit 03, which includes the predetermined functional layer 12 and the predetermined electrode 02. An overlapping region is between an orthographic projection region of the predetermined functional layer 12 on the base substrate 11 and an orthographic projection region of the predetermined electrode 02 on the base substrate 11.

For example, the display panel 01 includes the array substrate 011 and an opposite substrate 012 disposed opposite to each other (for example, the array substrate 011 and the opposite substrate 012 are connected together via a sealant). The predetermined functional layer 12 is located between the array substrate 011 and the opposite substrate 012. The predetermined electrode 02 is located on a side, away from the opposite substrate 012, of the base substrate 011.

The embodiments of the present disclosure provide the pressure-sensitive display device. The pressure-sensitive display device includes the pressure-sensitive display panel 0 as described above. The pressure-sensitive display device for example is any product or component having a display function such as a liquid crystal panel, an organic light emitting diode display panel, an electronic paper, a cell phone, a tablet computer, a television, a display, a notebook computer, a digital photo frame, a navigator and the like.

The embodiments of the present disclosure provide the pressure-sensitive display device. The pressure-sensitive display panel in the pressure-sensitive display device includes the display panel and the predetermined electrode disposed on the outer side of the display panel, and both the predetermined functional layer in the display panel and the predetermined electrode are connected to the pressure-sensitive control unit, the predetermined functional layer in the display panel serves as the auxiliary electrode in the pressure-sensitive unit, that is, the outer side of the display panel in the present disclosure only is provided with the predetermined electrode, without the need of providing the auxiliary electrode and the insulation layer on the outer side of the display panel, and thus the thickness of the pressure-sensitive display panel is reduced.

Those skilled in the art can clearly understand that, for convenience and brevity of description, the above embodiments of the pressure-sensitive display panel, the above embodiments of the method for manufacturing the pressure-sensitive display panel, and the above embodiments of the pressure-sensitive display device may be referred to each other, and detailed descriptions are omitted herein.

What are described above is related to the illustrative embodiments of the disclosure only and not limitative to the scope of the disclosure; the scopes of the disclosure are defined by the accompanying claims.

This application claims the benefit of Chinese Patent Application No. 201610844352.4, filed on Sep. 22, 2016, which is hereby entirely incorporated by reference as a part of the present application.

What is claimed is:

1. A pressure-sensitive display panel, comprising:
a display panel comprising an array substrate, wherein the array substrate comprises a base substrate and a predetermined functional layer which is formed on the base substrate and formed of a conductive material;
a predetermined electrode on an outer side of the display panel; and
a pressure-sensitive control unit,
wherein an overlapping region is between an orthographic projection region of the predetermined functional layer on the base substrate and an orthographic projection region of the predetermined electrode on the base substrate, and both the predetermined functional layer and the predetermined electrode are connected to the pressure-sensitive control unit,
wherein one of the predetermined functional layer and the predetermined electrode comprises an auxiliary electrode, an overlapping region is between an orthographic projection region of the auxiliary electrode on the base substrate and an orthographic projection region of the other of the predetermined functional layer and the predetermined electrode on the base substrate, and the auxiliary electrode is connected to the pressure-sensitive control unit, and
wherein the auxiliary electrode comprises at least two first strip electrodes and at least one second strip electrode, a length direction of each of the first strip electrodes is intersected with a length direction of the second strip electrode, a (2n+1)th first strip electrode and a (2n+2)th first strip electrode are connected together via the at least one second strip electrode, and n is an integer greater than or equal to zero.

2. The pressure-sensitive display panel according to claim 1, wherein the outer side of the display panel is a light incident side of the display panel.

3. The pressure-sensitive display panel according to claim 1, wherein the predetermined functional layer further comprises a light-shielding pattern, and no overlapping region is between the orthographic projection region of the auxiliary electrode on the base substrate and an orthographic projection region of the light-shielding pattern on the base substrate.

4. The pressure-sensitive display panel according to claim 1, wherein a shielding electrode is on the base substrate, and the orthographic projection region of the auxiliary electrode on the base substrate is within an orthographic projection region of the shielding electrode on the base substrate.

5. The pressure-sensitive display panel according to claim 4, wherein a buffer layer, an active layer, a gate insulation layer, a gate pattern, an interlayer dielectric layer, and a source/drain layer pattern are sequentially on the base substrate, and the source/drain layer pattern comprises a source electrode, a drain electrode, and the shielding electrode.

6. The pressure-sensitive display panel according to claim 4, wherein
an insulation layer and a common electrode layer pattern are sequentially on the base substrate; and
the common electrode layer pattern comprises a plurality of common electrodes arranged in an array, the plurality of common electrodes comprises at least one touch common electrode, each touch common electrode is connected to one shielding electrode through a via hole in the insulation layer, and the shielding electrodes that any two of the touch common electrodes are respectively connected with are different from each other.

7. The pressure-sensitive display panel according to claim 6, further comprising a touch control unit, wherein each shielding electrode connected with the touch common electrode is connected with the touch control unit.

8. The pressure-sensitive display panel according to claim 6, wherein the insulation layer, the common electrode layer pattern, a passivation layer, and a pixel electrode pattern are sequentially on the base substrate.

9. The pressure-sensitive display panel according to claim 1, wherein the auxiliary electrode comprises an effective auxiliary electrode and a connection auxiliary electrode, and the effective auxiliary electrode is connected to the pressure-sensitive control unit via the connection auxiliary electrode,
an effective area of a region of the auxiliary electrode on the base substrate is a sum of a first effective area and a second effective area, the first effective area is an area of an overlapping region between an orthographic projection region, on the base substrate, of the effective auxiliary electrodes located in the region of the auxiliary electrode and the orthographic projection region of the other of the predetermined functional layer and the predetermined electrode, and the second effective area is an area of an overlapping region in the region of the auxiliary electrode and between an orthographic projection region, on the base substrate, of the connection auxiliary electrode connected to the effective auxiliary electrodes in the region of the auxiliary electrode and the orthographic projection region of the other of the predetermined functional layer and the predetermined electrode; and
the effective area of the region of the auxiliary electrode region on the base substrate close to the pressure-sensitive control unit is greater than the effective area of the region of the auxiliary electrode region on the base substrate away from the pressure-sensitive control unit.

10. The pressure-sensitive display panel according to claim 1, wherein the display panel further comprises a color filter substrate which comprises a black matrix, and
the orthographic projection region of the auxiliary electrode on the base substrate is within an orthographic projection region of the black matrix on the base substrate.

11. The pressure-sensitive display panel according to claim 1, wherein the auxiliary electrode comprises at least four first strip electrodes, the (2n+1)th first strip electrode, the (2n+2)th first strip electrode, a (2n+3)th first strip electrode, and a (2n+4)th first strip electrode are sequentially arranged in a direction from a position away from the pressure-sensitive control unit to a position close to the pressure-sensitive control unit,
the (2n+1)th first strip electrode and the (2n+2)th first strip electrode are connected together via p second strip electrodes, the (2n+3)th first strip electrode and the (2n+4)th first strip electrode are connected together via q second strip electrodes, each of p and q is an integer greater than or equal to 1, and q is greater than p.

12. The pressure-sensitive display panel according to claim 1, wherein the predetermined electrode is a middle frame on a light incident side of the display panel.

13. A pressure-sensitive display device, comprising the pressure-sensitive display panel according to claim 1.

14. A method for manufacturing a pressure-sensitive display panel, comprising:
manufacturing a display panel, wherein an array substrate in the display panel comprises a base substrate and a predetermined functional layer which is on the base substrate and formed of a conductive material;
providing a predetermined electrode on an outer side of the display panel, wherein an overlapping region is between an orthographic projection region of the predetermined functional layer on the base substrate and an orthographic projection region of the predetermined electrode on the base substrate; and
connecting both the predetermined functional layer and the predetermined electrode to a pressure-sensitive control unit to form the pressure-sensitive display panel,
wherein one of the predetermined functional layer and the predetermined electrode comprises an auxiliary electrode, an overlapping region is between an orthographic projection region of the auxiliary electrode on the base substrate and an orthographic projection region of the other of the predetermined functional layer and the predetermined electrode on the base substrate, and the auxiliary electrode is connected to the pressure-sensitive control unit, and
wherein the auxiliary electrode comprises at least two first strip electrodes and at least one second strip electrode, a length direction of each of the first strip electrodes is intersected with a length direction of the second strip electrode, a (2n+1)th first strip electrode and a (2n+2)th first strip electrode are connected together via the at least one second strip electrode, and n is an integer greater than or equal to zero.

15. The method according to claim 14, wherein the manufacturing the display panel comprises:
forming the predetermined functional layer on the base substrate, wherein the predetermined functional layer comprises a light-shielding pattern and the auxiliary electrode, an orthographic projection region of the auxiliary electrode on the base substrate overlaps the orthographic projection region of the predetermined electrode on the base substrate and does not overlap an orthographic projection region of the light-shielding pattern on the base substrate.

16. The method according to claim 15, wherein the manufacturing the display panel further comprises:
forming a shielding electrode on the base substrate formed with the predetermined functional layer, wherein the orthographic projection region of the auxiliary electrode on the base substrate is within an orthographic projection region of the shielding electrode on the base substrate.

17. The method according to claim 16, wherein the manufacturing the display panel further comprises:
sequentially forming an insulation layer and a common electrode layer pattern on the base substrate, wherein the common electrode layer pattern comprises a plurality of common electrodes arranged in an array, the plurality of common electrodes comprises at least one touch common electrode, each touch common electrode is connected to one shielding electrode through a via hole in the insulation layer, the shielding electrodes that any two of the touch common electrodes are respectively connected with are different from each other, and each shielding electrode connected to the touch common electrode is connected to a touch control unit.

18. A pressure-sensitive display panel, comprising:
a display panel comprising an array substrate, wherein the array substrate comprises a base substrate and a predetermined functional layer which is on the base substrate and formed of a conductive material; and
a predetermined electrode on an outer side of the display panel,
wherein the pressure-sensitive display panel further comprises a pressure-sensitive unit, the pressure-sensitive unit comprises the predetermined functional layer and the predetermined electrode, an overlapping region is between an orthographic projection region of the predetermined functional layer on the base substrate and an orthographic projection region of the predetermined electrode on the base substrate,
wherein one of the predetermined functional layer and the predetermined electrode comprises an auxiliary electrode, an overlapping region is between an orthographic projection region of the auxiliary electrode on the base substrate and an orthographic projection region of the other of the predetermined functional layer and the predetermined electrode on the base substrate, and
wherein the auxiliary electrode comprises at least two first strip electrodes and at least one second strip electrode, a length direction of each of the first strip electrodes is intersected with a length direction of the second strip electrode, a (2n+1)th first strip electrode and a (2n+2)th first strip electrode are connected together via the at least one second strip electrode, and n is an integer greater than or equal to zero.

* * * * *